US008343424B2

(12) United States Patent
Dirksen et al.

(10) Patent No.: US 8,343,424 B2
(45) Date of Patent: Jan. 1, 2013

(54) ANALYSIS DEVICE WITH AN ARRAY OF FOCUSING MICROSTRUCTURES

(75) Inventors: Peter Dirksen, Eindhoven (NL); Yuri Aksenov, Leuven (NL); Fredericus Christiaan Van Den Heuvel, Eindhoven (NL); Johannes Arnoldus Jacobus Maria Kwinten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 827 days.

(21) Appl. No.: 12/097,082

(22) PCT Filed: Dec. 15, 2006

(86) PCT No.: PCT/IB2006/054882

§ 371 (c)(1), (2), (4) Date: Jun. 12, 2008

(87) PCT Pub. No.: WO2007/069222

PCT Pub. Date: Jun. 21, 2007

(65) Prior Publication Data

US 2008/0305970 A1 Dec. 11, 2008

(30) Foreign Application Priority Data

Dec. 15, 2005 (EP) .................................... 05112195

(51) Int. Cl.
*G01N 21/01* (2006.01)

(52) U.S. Cl. ............ 422/68.1; 436/5; 356/244; 438/16; 438/29; 438/42

(58) Field of Classification Search ..... 436/5; 422/68.1; 356/244; 438/16, 29, 42
See application file for complete search history.

(56) References Cited

U.S. PATENT DOCUMENTS

| | | | | |
|---|---|---|---|---|
| 6,379,573 | B1 | 4/2002 | Kim et al. | |
| 6,585,939 | B1 * | 7/2003 | Dapprich | 422/503 |
| 6,759,662 | B1 * | 7/2004 | Li | 250/458.1 |
| 6,806,954 | B2 | 10/2004 | Sandstrom | |
| 6,953,695 | B1 | 10/2005 | Langowski | |
| 7,221,512 | B2 * | 5/2007 | Steenblik et al. | 359/569 |
| 2003/0081722 | A1 | 5/2003 | Kandaka et al. | |
| 2003/0143724 | A1 | 7/2003 | Cerrina et al. | |
| 2005/0117148 | A1 | 6/2005 | Dirksen et al. | |

FOREIGN PATENT DOCUMENTS

| | | | |
|---|---|---|---|
| DE | 4416826 | A1 | 11/1995 |
| EP | 0800075 | A1 | 10/1997 |
| EP | 0998977 | A2 | 5/2000 |
| JP | 2004333654 | A | 11/2004 |
| WO | WO2007069221 | A2 | 6/2007 |

* cited by examiner

*Primary Examiner* — Jill Warden
*Assistant Examiner* — Monique Cole

(57) ABSTRACT

A device includes first and second material facing towards each other as to form at least one focusing microstructure with a focal point located outside of the first material.

10 Claims, 5 Drawing Sheets

ANALYSIS DEVICE WITH AN ARRAY OF FOCUSING MICROSTRUCTURES

The present invention is directed to the field of devices for the handling and/or detection of one or more analytes in a sample.

The present invention is furthermore directed to the field of characterizing or assessing the quality of an optical projection printer such as a wafer stepper or wafer scanner, as well as to the field of characterizing a photosensitive material such as photo-resist.

The present invention also relates to an integrated circuit (IC) manufacturing method, where the chip making process is optimized using a special wafer and test mask.

The present invention is directed to the handling and the detection of analytes in samples, especially to the detection of biomolecules in solution. The detection usually occurs in that way, that the fluid to be analyzed is provided on a substrate material, which contains binding substances for the analytes which are subject of the detection. Such a capture probe may be a corresponding DNA-strand in case the analyte is also a DNA-Strand. The analytes in the fluid, which are usually equipped with a label, preferably an optical fluorescence label, will then be captured by the binding substance (in case of two complementary DNA strands this process is called hybridization) and remain there even after the fluid is removed. The analyte may then be detected.

However, in case of optical detection, the resolution of the detection step is somewhat diminished since for a very small volume or amount of analyte in the sample, the signal/noise ratio becomes too small in order to have a proper analysis of the sample.

It is therefore an object of the present invention to provide an analysis device, which allows to achieve a better resolution.

This object is solved by a device according to claim 1 of the present application. Accordingly, a device comprising a first material and a second material is provided whereby the first and the second material are so provided towards each other as to form at least one focusing microstructure with a focal point located outside of the first material.

By doing so, one or more of the following advantages can be achieved by the present invention:

due to the high numerical aperture n.NA>1, with n the refractive index and NA the geometrical aperture, a very high resolution is obtained, the mirror generated by the focal microstructure is achromatic (no colour errors) and therefore has the same optical properties such as the focal length, regardless the optical wavelength, when a silicon wafer is taken as a substrate this makes it tailor made in an IC-manufacturing environment, the obtainable very high resolution, below 30 nanometer for an optical wavelength of 193 nanometer enables the device to study an IC-manufacturing process, including stepper tool assessment, when that glass or plastic or poly styrene is used as a substrate, the device becomes attractive for low cost medical or bio applications, due to the concentration of light by the focusing microstructure, the signal/background ratio can for most application be improved, the device can however, in most applications be kept quite simple avoiding sophisticated designs, the focal microstructure of the device can in a lot of applications be used in an easy way to test the production of the device (as will be described later on), increased collection efficiency due to re-direction and collection of scattered light from bottom hemi-sphere, In the sense of the present invention, the term "focal point" includes the point where a collimated beam will focus when reflected by the focusing microstructure.

According to an embodiment of the invention, the first and the second material are so provided towards each other as to form at least one focusing microstructure with an image point which has a distance from ≧0 to ≦width*2 from the focal point, whereby "width" is the width of the focal microstructure.

According to an embodiment of the invention, the first and the second material are so provided towards each other as to form at least one focusing microstructure with an image point which has a distance from ≧0 to ≦width from the focal point.

In the sense of the present invention, the term "image point" includes the point where an image is formed by the focusing microstructure.

In the sense of the present invention, the terms "height" and "width" include the following: "height" is the distance between a pole of the mirror and a section plane, which in fact is a chord for an obtained circle and width is the length of this chord.

According to a preferred embodiment of the present invention, the focusing microstructure has a spherical form.

According to a preferred embodiment of the present invention, the focusing microstructure has an elliptical form.

By doing so, a focal microstructure for use in the present invention can for most applications be provided by the easiest way.

According to a preferred embodiment, the height: width ratio of the focusing microstructure is ≧0.1:1 and ≦1:1, preferably ≧0.2:1 and ≦0.8:1 and most preferred ≧0.3:1 and ≦0.6:1.

According to a preferred embodiment, the focal length: height ratio of the focusing microstructure is ≧1:1 and ≦3:1, preferably ≧1.5:1 and ≦2.5:1 and most preferred ≧1.8:1 and ≦2:1.

The term "focal length" in the sense of the present invention includes the distance from the focal point of the microstructure to the bottom of the recess in the first material.

According to a preferred embodiment of the present invention, the height of the at least one focal microstructure is ≧0.2 μm to ≦100 μm, preferably ≧1 μm to ≦80 μm, more preferably ≧5 μm to ≦50 μm and most preferred ≧10 μm to ≦30 μm.

According to a preferred embodiment of the present invention, the width of the at least one focal microstructure is ≧2 μm to ≦100 μm, preferably ≧10 μm to ≦80 μm, more preferably ≧20 μm to ≦70 μm and most preferred ≧30 μm to ≦50 μm.

According to a preferred embodiment of the present invention, at least one of the focal microstructures is provided in the form of a groove According to a preferred embodiment of the present invention, at least one of the focal microstructures is provided in the form of an elongated stripe.

It should be noted that in the sense of the present invention the term "stripe" is not limited to somewhat straight structures: according to an embodiment of the present invention, the stripes include bent and/or curved elements.

According to a preferred embodiment of the present invention, the first material has an absorbance value k of ≧0.2 and ≦2. This has shown to be best suitable within the present invention. Preferably the first material has an absorbance value k of ≧0.5 and ≦1.8, more preferred ≧1 and ≦1.5.

In the sense of the present invention, the term "absorbance value" means and/or includes especially the imaginary part of the material's refractive index According to a preferred embodiment of the present invention, the first material is selected out of the group comprising Si, Mo, Ti, TiO, TiN, Al Au, Ag, Cu, organic polymers, preferably selected out of the group comprising polyacrylic acid, poly(meth)-acrylic acid, polyacrylic esters, poly(meth)-acrylic esters, polycarbonates, polystyrene and mixtures thereof, $SiO_2$ or mixtures thereof.

According to a preferred embodiment of the present invention, the first material has an index of refraction n (real part) of ≧0.1 and ≦7. Preferably, the second material has an index of refraction n of ≧0.10 and ≦5, more preferred ≧0.99 and ≦2.

According to a preferred embodiment of the present invention, the second material has an absorbance value k of ≧0 and ≦0.2. This has shown to be best suitable within the present invention. Preferably the second material has an absorbance value k of ≧0.0 and ≦0.1, more preferred ≦0.

According to a preferred embodiment of the present invention, the second material is selected out of the group comprising $SiO_2$, $Al_2O_3$, HfO, $MgF_2$ $Ta_2O_5$ and mixtures thereof.

According to a preferred embodiment of the present invention, the second material has an index of refraction n of ≧1.3 and ≦3. Preferably, the second material has an index of refraction n of ≧1.5 and ≦2.5, more preferred ≧1.7 and ≦2.2.

According to a preferred embodiment of the present invention, the focusing microstructure has—in top view—an essentially circular shape.

According to a preferred embodiment of the present invention, the device comprises a plurality of focusing microstructure, which have—in top view—an essentially circular shape.

According to a preferred embodiment of the present invention, the device comprises a plurality of focusing microstructure which have—in top view—an essentially circular shape and being arranged in a periodic pattern, whereby the pitch P between two focal microstructures is preferably P ≧D, preferably P≧2*D.

According to a further embodiment of the present invention, the device comprises a plurality of focusing microstructure which are form as elongated stripes with a length L, whereby preferably L is ≧W, with W being the width of the focal microstructure According to a preferred embodiment of the present invention, L is ≧50*W, preferably L is ≧100*W, preferably L is ≧1000*W, preferably L is ≧10000*W According to a preferred embodiment of the present invention, the device further comprises a light emitting means which emits light towards the focal microstructure and a detecting means for detect the light e.g. emitted by the labeled analyte.

The present invention furthermore relates to a method of producing a device according to the present invention comprising the steps of (a) providing a first material (b) providing at least one recess in the first material (c) providing the second material in such a way that at least one recess is filled by the second material (d) optionally removing, preferably polishing away a part of the second material and/or first material (e) optionally applying a third material, preferably a thin metallic coating or a dielectric coating to improve the reflexivity of the mirror.

According to a preferred embodiment of the present invention, the step (b) includes dry etching of the first material.

According to a preferred embodiment of the present invention the dry etching step includes providing an oxide hard mask on the first material, which comprises at least one hole, providing the etching material through the hole to the first material and subsequently removing the oxide hard mask.

According to a preferred embodiment of the present invention, the oxide hard mask is somewhat formed in form of a layer with a thickness of ≧100 nm and ≦1000 nm.

According to a preferred embodiment of the present invention, the at least one hole in the oxide hard mask has a diameter of ≧0.05 μm and ≦5 μm.

According to a preferred embodiment of the present invention, the at least one hole in the oxide hard mask has a diameter of ≧0.1 μm and ≦1 μm.

According to a preferred embodiment of the present invention, the step (b) includes etching with a material comprising an oxidising agent and an acid. Preferably the oxidizing agent is $H_2O_2$; preferably the acid is a mineral acid, more preferred $H_2SO_4$. Preferably the ratio of oxidising agent and acid is ≧0.05:1 and ≦0.2:1. Preferably the etching with a material comprising an oxidising agent and an acid is done for a time period of ≧1 min and ≦5 min.

According to a preferred embodiment of the present invention, the step (b) includes etching with a material comprising an oxidising agent and a base. Preferably the oxidizing agent is $H_2O_2$; preferably the base is aqueous ammonia. Preferably the ratio of oxidising agent and base is ≧0.05:1 and ≦0.2:1. Preferably the etching with a material comprising an oxidising agent and a base is done for a time period of ≧1 min and ≦5 min.

According to a preferred embodiment of the present invention, the step (b) includes etching with a material comprising an oxidising agent and an acid and then subsequently etching with a material comprising an oxidising agent and a base.

According to a preferred embodiment of the present invention, the oxide hard mask is stripped after providing the etching material. Preferably the oxide hard mask is stripped with an ≧1% and ≦50% aqueous HF-Solution.

According to a preferred embodiment of the present invention, the step (d) includes etching of the second material.

The present invention furthermore relates to a method of testing a IC production means, i.e. a wafer stepper or scanner for the quality of production of IC's and including the testing of the photo resist comprising the steps of (a) providing on the wafer a plurality of focal microstructures according to claim 1

(b) coating the wafer with photo resist.

(c) providing a special test mask with test structures (d) imaging the test mask by the stepper on the mirror structures.

(e) develop the resist pattern (f) evaluating the patterns on the mirror wafer and/or judging the wafer production means on the results of step (b), by using optical microscopes, a scaterometer, AFM, or a scanning electron microscope, either top-down or in cross section.

(g) using the evaluation results to modify the tool set-up to modify the mask layout and thus to improve the IC manufacturing process The inventors have found out that the present invention may be of use for testing the quality of a wafer production means, which usually comprises a wafer stepper or scanner and a resist supplying means. The quality of this wafer production means is essential for the production of the wafers, which has to be done with a great diligence and accuracy. Therefore the steps of producing the wafers are subject to constant monitoring. A system for determining the accuracy of an optical imaging system is disclosed in the US 2005/0117148 A1 to Dirksen et al.

Such a wafer production means will in most applications comprise one or more of the following devices:

1) a wafer stepper or wafer scanner, e.g. optical tool which projects an image from a reticle onto a photo sensitive layer (called resist) on a silicon wafer.

2) a resist development, etching, deposition or polishing tool.

After being processed in the wafer stepper/scanner, subsequently, the wafer is taken out of the stepper and is transferred to a resist development, etching, deposition or polishing tool. This cycle is in most applications repeated a number of times (20-30 times).

If a wafer according to the present invention is used in such a wafer production means, it is possible e.g. by scanning in a microscope to judge the accuracy of the wafer production means.

According to a preferred embodiment of the present invention, the method comprises the following steps:

a) arranging a test reticle in the reticle plane or object plane, of the imaging system of the IC production means to be tested;

b) arranging a photo resist coated wafer as described within the present invention in the wafer plane of an imaging system of the wafer production means to be tested;

c) forming a number of exposures of the test reticle by means of the imaging system, each test image being formed with another focus or exposure dose of the imaging system;

d) developing the photo resist on the wafer detecting the test image by means of a detection device having a resolution better than that of imaging system, and e) analyzing an output signal of the detection device to determine values of wafer stage position noise and wafer stage focus noise as well as also resist parameters such as the diffusion length.

According to a preferred embodiment of the present invention, the wafer is provided with at least one alignment mark for the purpose of aligning the wafer in the stepper. Then the stepper can easily image the test reticle structures at predetermined positions of the wafer, i.e. the location where the mirrors are.

According to an embodiment of the present invention, the wafer is also provided with additional marks, usually of a different layout, for the purpose of aligning the wafer in the optical microscope, AFM or SEM (scanning electron microscope).

According to a preferred embodiment of the present invention, the wafer is provided with at least one mark comprising information about the wafer and/or the positions of the microstructure on the wafer.

The present invention furthermore relates to a computer program comprising software for performing the method(s) as described above.

The present invention furthermore relates to a process of manufacturing devices such as the manufacturing of in general chips, microprocessor or memory devices whereby a wafer according to the present invention is used as a test wafer, the wafer production means is judged by one or more of the methods as described before and the results are used to re-setting of elements of this system at the hand of the result of the detection and/or judgement A device according to the present invention as well as a device as produced with the present method and/or the method for testing a device may be of use in a broad variety of systems and/or applications, amongst them one or more of the following:

biosensors used for molecular diagnostics, rapid and sensitive detection of proteins and nucleic acids in complex biological mixtures such as e.g. blood or saliva, high throughput screening devices for chemistry, pharmaceuticals or molecular biology, testing devices e.g. for DNA or proteins e.g. in criminology, for on-site testing (in a hospital), for diagnostics in centralized laboratories or in scientific research, tools for DNA or protein diagnostics for cardiology, infectious disease and oncology, food, and environmental diagnostics, tools for combinatorial chemistry, analysis devices, nano- and micro-fluidic devices.

The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, characteristics and advantages of the object of the invention are disclosed in the subclaims, the figures and the following description of the respective figures and examples, which—in an exemplary fashion—show preferred embodiments of a devide according to the invention.

FIG. 1 shows a very schematic cross-sectional view of an assembly of a first and second material according to a first embodiment of the present invention FIG. 2 shows a perspectivic view of a second material according to a second embodiment of the present invention FIG. 3 shows a very schematic cross-sectional view of an assembly of a first and second material as in FIG. 1 indicating the focal length and the height of the focal microstructure.

FIG. 4 shows a very schematic cross-sectional view of an assembly of a first and second material according to a second embodiment of the present invention FIG. 5 shows a very schematic top view of an assembly of a plurality of focal microstructures with circular shape FIG. 6 shows a very schematic cross-sectional view of an assembly of a first and second material according to a third embodiment of the present invention with a photo-resist material;

Figure 1:
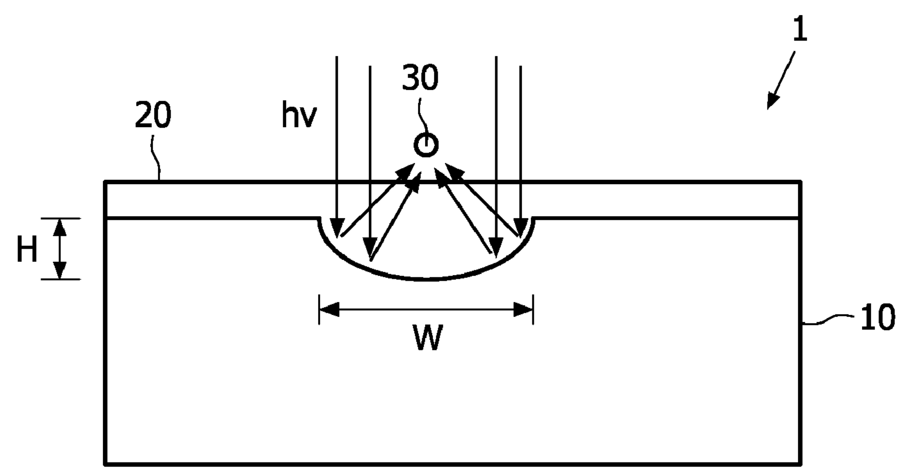

FIG. 1 shows a very schematic cross-sectional view of an assembly 1 of a first and second material 10 and 20 according to a first embodiment of the present invention. As can be seen in FIG. 1, the first and second material 10 and 20 form a focusing microstructure which is somewhat spherical. Incoming light will be bent by the focusing microstructure and guided to the focal point 30 which is located outside either of the first and second material 10 and 20. The width and height of the focal microstructure is indicated by "W" and "H" respectively and is as described above.

Figure 2:
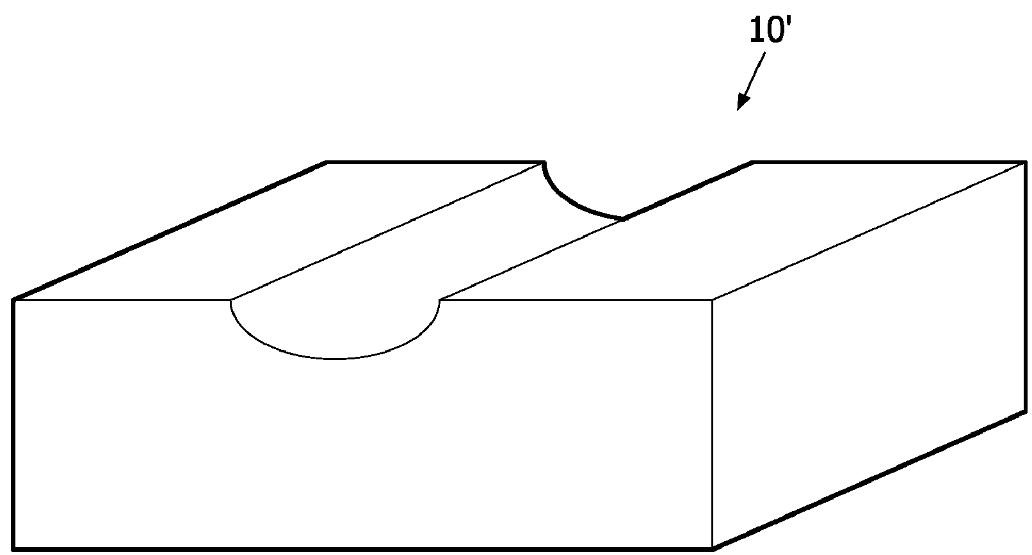

FIG. 2 shows a perspective view of a first material 10' according to a second embodiment of the present invention. As can be seen from FIG. 2, the focal microstructure is somewhat shaped as an elongated pit or groove. However, for some applications it may also be desired that the focal microstructure is formed as (when seen from the top) a circle or ellipsoid.

Figure 3:
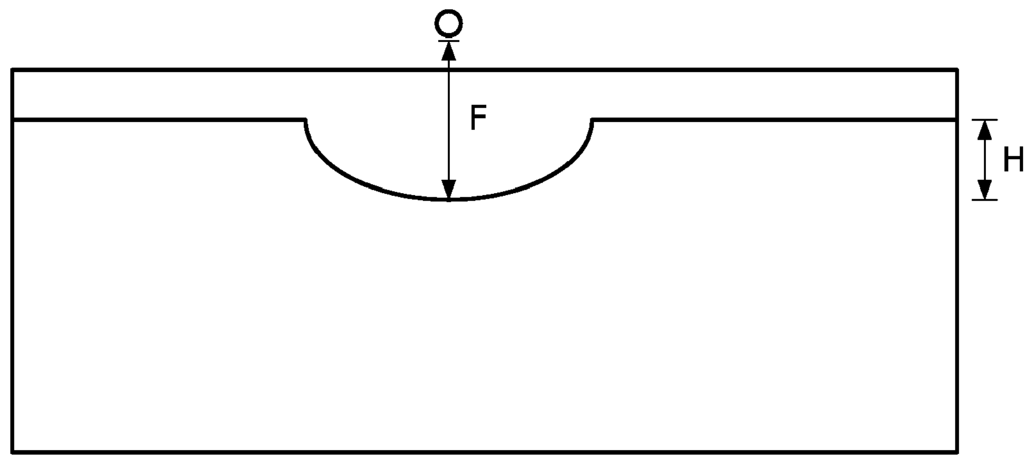

FIG. 3 shows a very schematic cross-sectional view of an assembly of a first and second material as in FIG. 1 indicating the focal length (as indicated by an "F") and the height (as indicated by an "H") of the focal microstructure.

Figure 4:
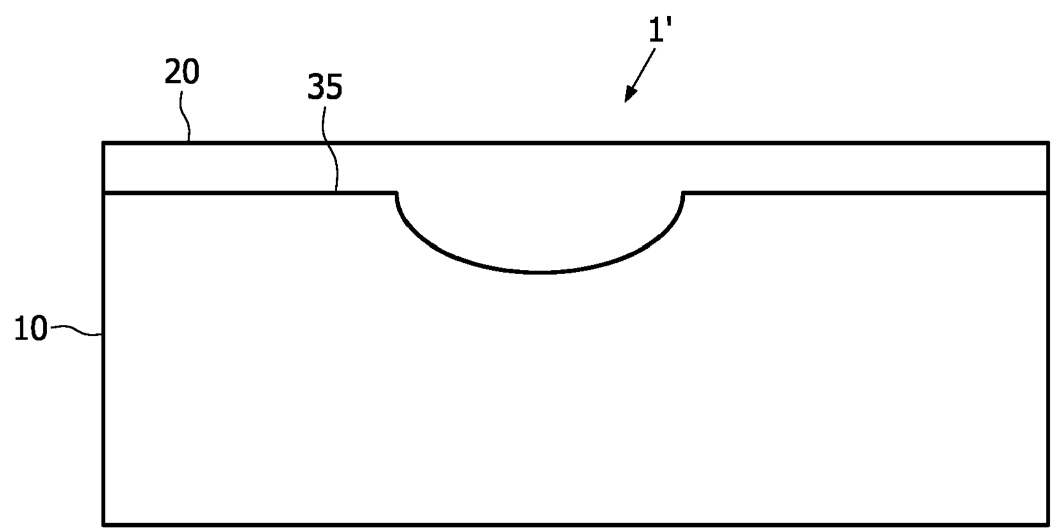

FIG. 4 shows a very schematic cross-sectional view of an assembly 1' of a first and second material according to a second embodiment of the present invention. This embodiment differs from that of FIG. 1 in that a coating 35 is provided between the first and second material. The coating may be of a metal material; however for some applications, the coating may also be an oxide material as described above. It should be noted that in FIG. 4, the coating covers all of the first material 10; however, in a different embodiment (not shown in the figs), the coating may only be present in and/or around the focal microstructure.

In another embodiment (also not shown in the figs), the second material has been removed in that way that only the recess is still filled by the second material whereas the other parts of the first material are not covered by the second material. This has also shown to be advantageous for some of the applications within the present invention.

Figure 5:
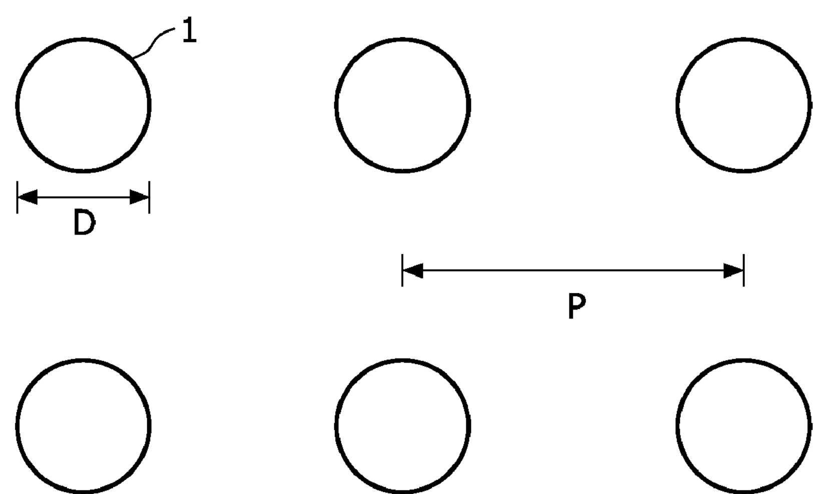

FIG. 5 shows a very schematic top view of an assembly of a plurality of focal microstructures with circular shape. The pitch P and the diameter D of the focal microstructures are as described above, i.e. $P>D$.

However, according to another embodiment (not shown in the figs), the focal microstructures may be arranged in a periodical pattern in form of elongated grooves or stripes.

Figure 6:
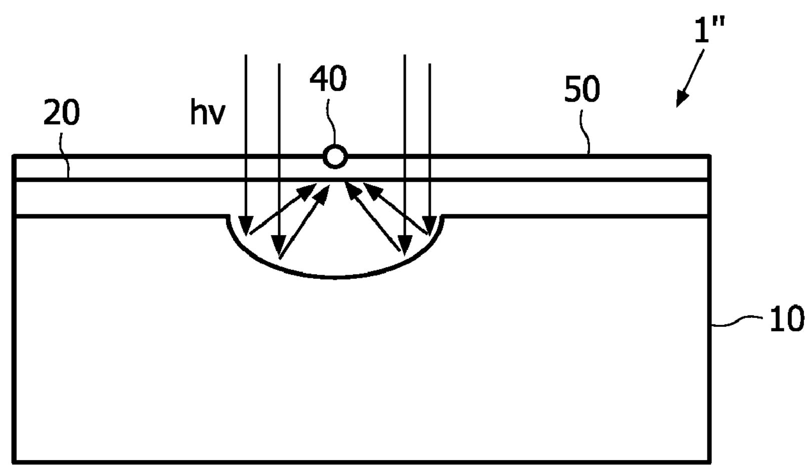

FIG. 6 shows a very schematic cross-sectional view of an assembly 1" of a first 10 and second 20 material according to a third embodiment of the present invention with a photo-resist material. The photo-resist is applied in form of a layer 50 (please note, that the "focal point" 40 is only shown for clarity reasons).

Figure 7:
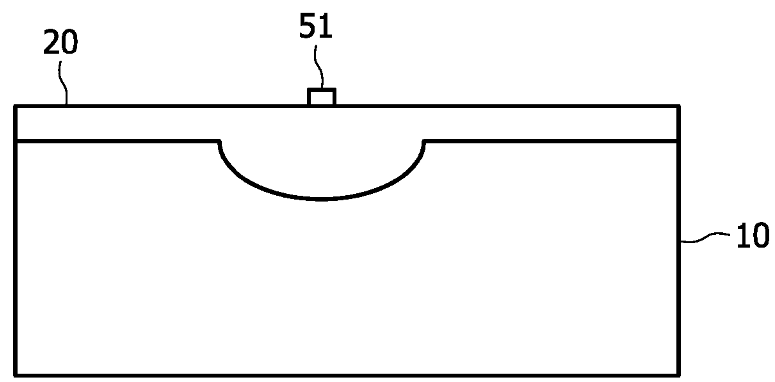
FIG. 7 shows a very schematic cross-sectional view of an assembly of a first and second material according to FIG. 6 after exposition of light and developing of the resist.

FIG. 7 shows a very schematic cross-sectional view of an assembly of a first and second material according to FIG. 6 after exposition of light and developing of the resist. The photoresist is in this embodiment exposed to parallel beams of light e.g. with a wavelength of 365, 248, 193 and/or 157 nm. After the development of the resist, a resist pattern 51 is formed.

Figure 8:
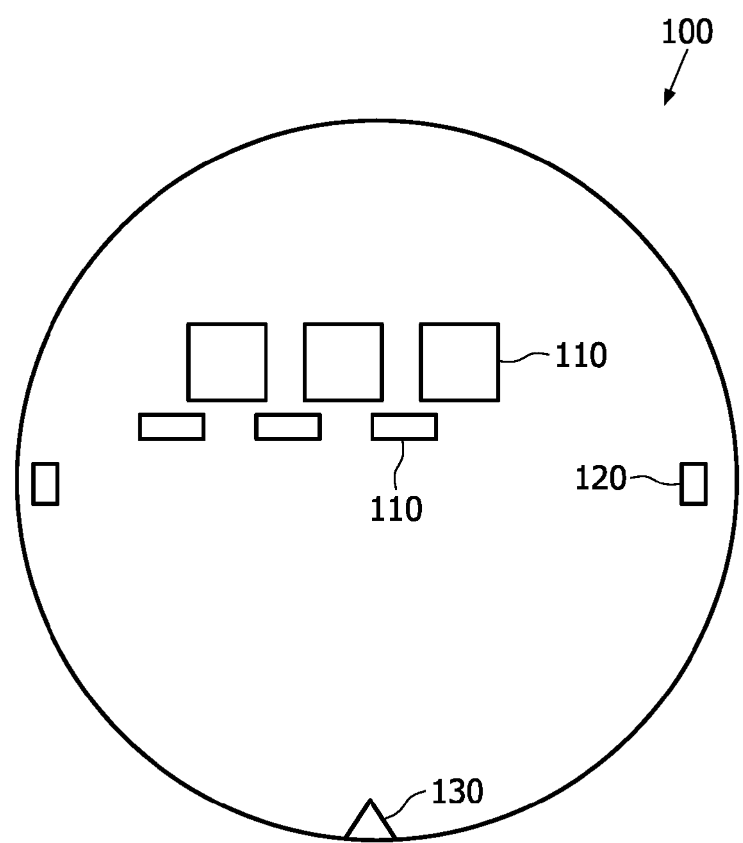
FIG. 8 shows a very schematic top view of a test wafer according to an embodiment of the present invention.

FIG. 8 shows a very schematic top view of a test wafer 100 according to an embodiment of the present invention. The wafer comprises a periodic pattern (only a few are shown, in reality there are much more present) of dies 110, which comprise an array of mirrors or linear mirrors. Typically, the dies will be around 26×32 mm for a scanner or 20×20 for a stepper. Furthermore, additional marks 120 for the stepper are present.

The wafer furthermore comprises an additional alignment mark 120 as described above, and a notch or flat 130.

It should be noted, that the focal microstructures may also be of use for a test mask (not shown in the figs), where an array of focal microstructures, e.g. similar to that shown in FIG. 5 is used.

Figure 9:
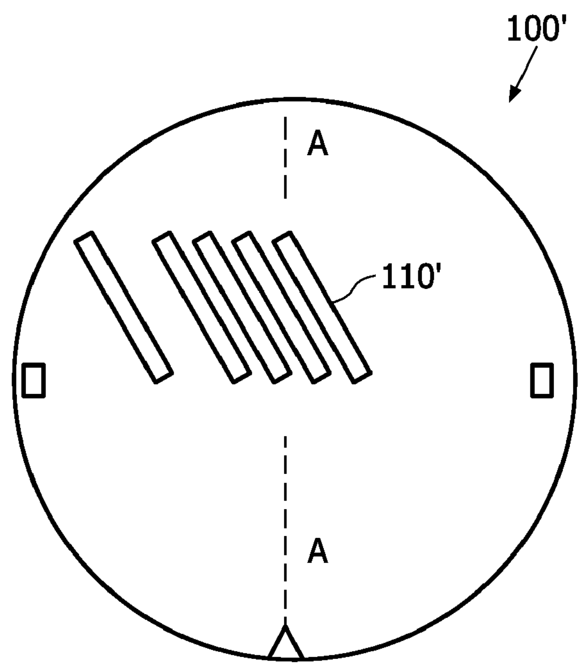
FIG. 9 shows a very schematic top view of a test wafer according to an embodiment of the present invention including focal microstructures in form of elongated stripes.

FIG. 9 shows a very schematic top view of a test wafer 100' according to an embodiment of the present invention including focal microstructures in form of elongated stripes. The wafer comprises a periodic pattern (only a few are shown, in reality there are much more present) of elongated stripes 110'. The further components of the test wafer are similar as in the test wafer shown in FIG. 8.

As can be seen in FIG. 9, the stripes 110' have an angle θ towards the virtual line as indicated with the letter "A" in FIG. 9 of about 30°. According to other embodiments (not shown in the figs.) the angle θ is selected from 0°, 45°, 60° and 90°.

Figure 10:
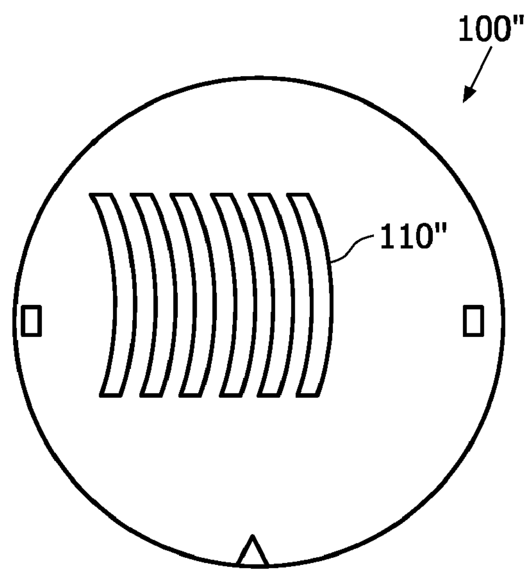
FIG. 10 shows a very schematic top view of a test wafer according to an embodiment of the present invention including focal microstructures in form of elongated curved stripes.

FIG. 10 shows a very schematic top view of a test wafer 100" according to an embodiment of the present invention including focal microstructures in form of elongated curved stripes 110'. The further components of the test wafer are similar as in the test wafer shown in FIGS. 8 and 9.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A device comprising;

a first material having at least one recess; and a second material facing towards the first material and filling the at least one recess to form at least one focusing microstructure having a reflective surface for focusing light reflected from the reflective surface at a focal point located outside the first material, wherein the first material includes at least one of Si, Mo, Ti, TiO, TiN glass, quartz, organic polymeric materials, and mixtures thereof, and wherein the second material includes at least one of $SiO_2$, HfO, $MgF_2$ $Ta_2O_5$, TiN, and mixtures thereof.

2. The device according to claim 1, wherein the at least one focusing microstructure has an image point, the image point being at a distance from greater than 0 to at most 2W from the focal point, wherein W is a width of the at least one focal microstructure, wherein the focal point includes a point where a collimated beam will focus when reflected by the at least one focusing microstructure, and wherein the image point includes a point where an image is formed by the focusing microstructure.

3. The device according to claim 1, wherein height: width ratio of the at least one focusing microstructure is at least 0.1:1 and at most 1:1.

4. The device according to claim 1, wherein focal length: height ratio of the at least one focusing microstructure is at least 1:1 and at most 3:1.

5. The device according to claim 1, wherein the at least one focal microstructure is in a form of an elongated stripe.

6. The device according to claim 1, wherein height: width ratio of the at least one focusing microstructure is at least 0.2:1 and at most 0.8:1.

7. The device according to claim 1, wherein height: width ratio of the at least one focusing microstructure is at least 0.3:1 and at most 0.6:1.

8. The device according to claim 1, wherein focal length: height ratio of the at least one focusing microstructure is at least 1.5:1 and at most 2.5:1.

9. The device according to claim 1, wherein focal length: height ratio of the at least one focusing microstructure is at least 1.8:1 and at most 2:1.

10. The device according to claim 1, wherein the organic polymeric materials comprise at least one of PMMA, polystyrene and polycarbonate.

* * * * *